United States Patent
Takahashi

(10) Patent No.: US 6,463,575 B1
(45) Date of Patent: Oct. 8, 2002

(54) CELL-LAYOUT METHOD IN INTEGRATED CIRCUIT DEVICES

(75) Inventor: Kazuhiro Takahashi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/493,606

(22) Filed: Jan. 28, 2000

(30) Foreign Application Priority Data

Jul. 6, 1999 (JP) .......................................... 11-192027

(51) Int. Cl.⁷ .............................................. G06F 17/50
(52) U.S. Cl. ................. 716/10; 716/8; 716/9; 716/11
(58) Field of Search .................... 716/1–21; 710/9; 707/7; 703/6, 12, 22; 257/206, 211, 700

(56) References Cited

U.S. PATENT DOCUMENTS 5,218,551 A * 6/1993 Agrawal et al. ............... 716/10
5,909,376 A * 6/1999 Scepanovic et al. ........... 716/8
6,230,304 B1 * 5/2001 Groeneveld et al. ........... 716/7

FOREIGN PATENT DOCUMENTS

JP 63-308676 12/1988
JP 6-291186 10/1994

* cited by examiner

Primary Examiner—Matthew Smith
Assistant Examiner—Naum Levin
(74) Attorney, Agent, or Firm—Burns, Doane, Swecker & Mathis, LLP

(57) ABSTRACT

A cell-layout method comprises the steps of: establishing cut lines in vertical and horizontal directions for substrate division; assuming an entire substrate as one cell-layout region and assigning all cells of an integrated circuit to the region; defining a set of the cells within the cell-layout region; determining a direction of the cut line to division-process the cell-layout region; selecting one cut line per row or column of non-processed cut lines in the horizontal or vertical direction based on the determined direction; determining a cell in the cell-layout region by implementing a Min-Cut division in cluster unit to the selected cut line, and implementing the division in parallel for a plurality of cut lines, thereby determining cells to be placed on the cell-layout region, with the result of cutting a process time in a large scale integrated circuit and avoiding local wire congestion.

5 Claims, 13 Drawing Sheets

CELL-LAYOUT METHOD IN INTEGRATED CIRCUIT DEVICES

BACKGROUND OF THE INVENTION

1. Field of the Invention

The present invention relates to a method of a cell-layout in an integrated circuit device, and more particularly, relates to a method of a cell-layout according to a Min-Cut layout method.

2. Description of the Prior Art

In a layout method, so-called a Min-Cut layout method, the following processes are repeated hierarchically to position cell-layouts: among a plurality of segments, called cut lines, established on a chip, one segment is selected, and a region on a chip is divided into two by the selected segment, and then cells are assigned (1) to reduce the number of nets (number of cuts) intersected with the cut lines as can be done, and (2) to equalize cell densities in two small regions generated by a division of the region on the chip into two by the cut line. The cell density here defines a ratio of the sum of cell areas assigned in a cell-layout region to cell areas allocable therein.

FIG. 11 is a flow chart showing a method of a cell-layout in an integrated circuit device according to a conventional Min-Cut method. In the drawing, ST1 designates a step of establishing a plurality of segments (hereinafter, referred to as "cut lines") which divides an integrated circuit substrate (hereinafter, referred to as "substrate") in vertical and horizontal directions, ST2 designates a step of assigning all the unplaced cells in the circuit in an entire substrate to be assumed as one cell-layout region, ST4 designates a step of determining a cut-line direction to be next processed in accordance with a predetermined turn, ST5 designates a step of distinguishing a division direction in accordance with the direction determined in the step ST4 to branch the process, ST6 and ST7 designate steps of selecting one cut line per row line and one cut line per column line in the cell-layout region on the substrate among non-processed cut lines in the horizontal and vertical directions, respectively, depending on the direction determined in the step ST4, ST33 denotes a step for processing a Min-Cut division on a single CPU with respect to the cut line selected in the step ST6 or ST7 one by one, ST9 designates a step of marking "processed" for the cut line selected in the step ST6 or ST7 and renewing cell-layout region information, and ST19 designates a step of distinguishing whether or not the processes have been completed with respect to all the cut lines. The steps ST4, ST5, ST6 or ST7, ST33, ST9, ST19 will be repeated in this order until a distinction that the processes have been completed with respect to all the cut lines in the step ST19.

The Min-Cut division is defined that after a cell-layout region intersected with a cut line is divided into two cell-layout regions by the cut line, the cells assigned at the cell-layout region before the division is transferred to the cell-layout region after the division so as to minimize the number of signal lines intersected with the cut lines and to equalize cell densities in the cell-layout regions after the division.

Next, FIGS. 3, 4, 12–14 are views for an operational explanation related to a conventional method of a cell-layout in an integrated circuit device. In the drawings, reference numerals 21a–21g denote peripheral input/output cells, 22a–22l denote cells to be placed, 23a–23u denote signal lines, 24a–24d denote logic hierarchy blocks, 25 denotes a substrate, 26a–26p denote slots for placing the peripheral input/output cells, 27a–27p denote slots for placing the cells, 28 denotes a wire grid designating a position where wires are passable, 29a–29f denote cut lines for the Min-Cut division process, 31a–31f denote cell-layout regions generated by the division, and 32a–32s denote wiring patterns.

Any one of the peripheral input/output cells 21a–21g may be placed on the slots 26a–26p. The layouts of the peripheral input/output cells are already determined herein, and the peripheral input/output cells 21a–21g are allocated at the slots 26a, 26c, 26f, 26g, 26n, 26k, 26i, respectively. Anyone of the cells 22a–22l may be placed at the inner slots 27a–27p. During a wiring process after the cell-layouts, the wiring patterns may be only passable for parts which are not blocked by the cells or other wires on the wire grids 28.

Referring to the flow chart in FIG. 11, the operation will be next described when the integrated circuit shown in FIG. 3 is placed on the substrate shown in FIG. 4.

In the step ST1 of FIG. 11, the cut lines 29a–29f for dividing the substrate 25 are established. It is here designed that in order to determine the cell-layouts after the divisions have been completed by all the cut lines, only one of the slots is contained in a field enclosed by the cut lines. It is assumed that alternate processes of horizontal and vertical divisions are predetermined with respect to the cut lines 29a–29f. All the cells 22a–22l are assigned as the entire substrate is considered as one cell-layout region in the step ST2. Since an implementation of the horizontal division is determined in the step ST4, the process flow branches to the step ST6 in the step ST5. The cut line 29e which divides the cell-layout region on the substrate is selected in the step ST6. The Min-Cut division is implemented by the cut line 29e in the step ST33.

The cells are here assigned in order to minimize the number of the signal lines intersected with the cut line 29e and to equalize cell densities in the two regions produced by the division. In this manner, as shown in FIG. 12, the two cell-layout regions 31a, 31b are created: in one of these regions, six cells of the cells 22a–22f are assigned on the upper side of the cut line 29e, i.e., on the side of the cell-layout region 31a, while in the other thereof, the remaining cells 22g–22l are assigned on the lower side of the cut line 29e, i.e., on the side of the cell-layout region 31b. In this situation, the signal lines 23g, 23i, 23m intersect with the cut line, and the number of the cuts becomes three. After a determination of the cell assignment, the mark "division-processed" is prepared for the cut line 29e in the step ST9, and the cell-layout region information is renewed in accordance with the above division-results.

At this point of time, the division by the cut line 29e is completed, the cell-layout region 31a assigned by the cells 22a–22f, and the cell-layout region 31b assigned by the cells 22g–22l are present on the substrate 25. In the next step ST19, the process flow goes back to the step ST4 due to the remaining non-processed cut lines. In the step ST4, an implementation of the vertical division is determined. Thus in the step ST7, the cut line 29b is selected, which divides the cell-layout regions 31a, 31b on the substrate 25 vertically.

Then, the steps ST33, ST9 are implemented with respect to the cut line 29b as well as the cut line 29e, and the division with respect to the cut line 29b is completed. As a result, as shown in FIG. 13, the cell-layout region 31c including the cells 22a, 22b, 22d, the cell-layout region 31d including the cells 22g, 22i, 22j, the cell-layout region 31e including the cells 22c, 22e, 22f, and the cell-layout region 31f including the cells 22h, 22k, 22l come to exist on the substrate 25.

Thereafter, the same divisions as the aforementioned cut lines 29e, 29b are implemented with respect to the cut lines 29*d*, 29*f* and the cut lines 29*a*, 29*c* in FIG. 4, respectively, until completion of the processes with respect to all the cut lines is distinguished in the step ST19. In these process steps, in the step ST6 the cut lines 29*d*, 29*f* are selected, and in the step ST7 the cut lines 29*a*, 29*c* are selected, while in the step ST33 the division processes are in turn implemented on a simple CPU one by one with respect to the respective cut lines when a plurality of cut lines are selected in the steps ST6, ST7 as described above.

At the point of time that the divisions with respect to all the cut lines are completed, as shown in FIG. 14, the following cell-layout results are provided: the cells 22*a*–22*l* are placed at the slots 27*a*, 27*b*, 27*d*, 27*e*, 27*g*, 27*i*, 27*l*, 27*m*, 27*n*, 27*o*, 27*p*, respectively. After the completion of such cell-layouts, one example is illustrated by the wiring patterns 32*a*–32*s* in FIG. 14, as a result that the wiring process is implemented between these cells to interconnect the signal lines 32*a*–32*u* mutually. As is apparent from FIG. 14, the signal lines 32*t*, 32*u* cannot be interconnected, falling in "wiring incapability".

SUMMARY OF THE INVENTION

Since a method of a cell-layout in an integrated circuit device has the above structure in the prior art as described above, there is a problem that it takes a very long process-time in a large scale integrated circuit since the Min-Cut division is implemented in cell unit and in a single CPU one by one. In addition, there is another problem that in the prior art method there occurs local wire congestion from concentration of signal lines to a part of the regions produced by the division, thus leading easily to signal lines of wiring incapability.

The present invention has been made to solve the above-described problem, and it is an object of the present invention to obtain a method of a cell-layout in an integrated circuit which produces more favorable results of layout and wiring with less local wire congestion in a short process-time.

A method of a cell-layout in an integrated circuit device according to the present invention comprises: a first step of establishing a plurality of cut lines in vertical and horizontal directions to divide a substrate; a second step of considering the entire substrate as one cell-layout region and assigning all the cells included in an integrated circuit in said cell-layout region; a third step of defining as one cluster a set of a plurality of cells within said cell-layout region; a fourth step of determining a direction of the cut line to division-process said cell-layout region; a fifth step of selecting one cut line per row or column of the cell-layout region on the substrate among non-processed cut lines in the horizontal or vertical direction based on the determined direction; a sixth step of determining a cell in said cell-layout region by implementing a Min-Cut division in cluster unit with respect to the selected cut line, thereby dividing the substrate into small regions, and implementing said division in parallel with respect to a plurality of the cut lines.

Thus, when there are a plurality of the cut lines in the same direction, the above division-processes may be implemented independently of each other; therefore, an implementation of parallel processes on a multiple CPUs results in reducing a process time while keeping a quality of the cell-layout.

The method according to the present invention further comprises: a seventh step for comparing the number of the cell-layout regions with a predetermined value; an eighth step for changing a height of said cell-layout region so as to equalize an estimated value of virtual wire congestion degree in a horizontal wire within the cell-layout region on the same column, and implementing again the cell-layout within the cell-layout region changed in height; and a ninth step for changing a width of said cell-layout region so as to equalize an estimated value of virtual wire congestion degree in a vertical wire within the cell-layout region on the same row, and implementing again the cell-layout within the cell-layout region changed in width.

Thus, even when the signal lines concentrate on a part of the cell-layout regions produced by divisions for the purpose of minimizing the number of the cuttings, the width or height of the cell-layout region is changed to equalize the virtual wire congestion degree, and then the division of the cell-layout region intersecting with the processed cut line by that change is implemented again; such a process of equalizing the virtual wire congestion degree in each of the regions is implemented, resulting in cell-layouts with less local wire congestion.

The method according to the present invention is characterized in that in the third step, by use of logic hierarchy structure information added to the cells at the time of a logic design of the integrated circuit, defined as a cluster is a set of cells included in the largest logic hierarchy block among those smaller than an upper limit of a cluster size determined in response to the size of the small region generated by the division of the cell-layout region by the cut line.

Thus, with the progress of that division, a set of cells included in the lower logic hierarchy block with the progress of the division is defined as a cluster, which results in cutting further the process-time.

The method according to the present invention is characterized in that in the third step, defined as a cluster is only a block such that a ratio of the number of signal lines connected with only the cells within the logic hierarchy block to the number of signal lines connected with said cells is larger than a predetermined reference value, which results in a favorable cell-layout result.

The method of the present invention is characterized in that the Min-Cut division with respect to the plurality of cut lines in the sixth step is implemented in independent, parallel process by a plurality of CPUs.

Thus, even when a large scale integrated circuit is processed, the division by a plurality of cut lines may be implemented with concurrent proceeding of the plurality of CPUs, resulting in implementing the cell-layout in a short process time.

DETAILED DESCRIPTION OF THE PREFERRED EMBODIMENTS

An embodiment of the present invention will be described below.

Embodiment 1

Figure 1:
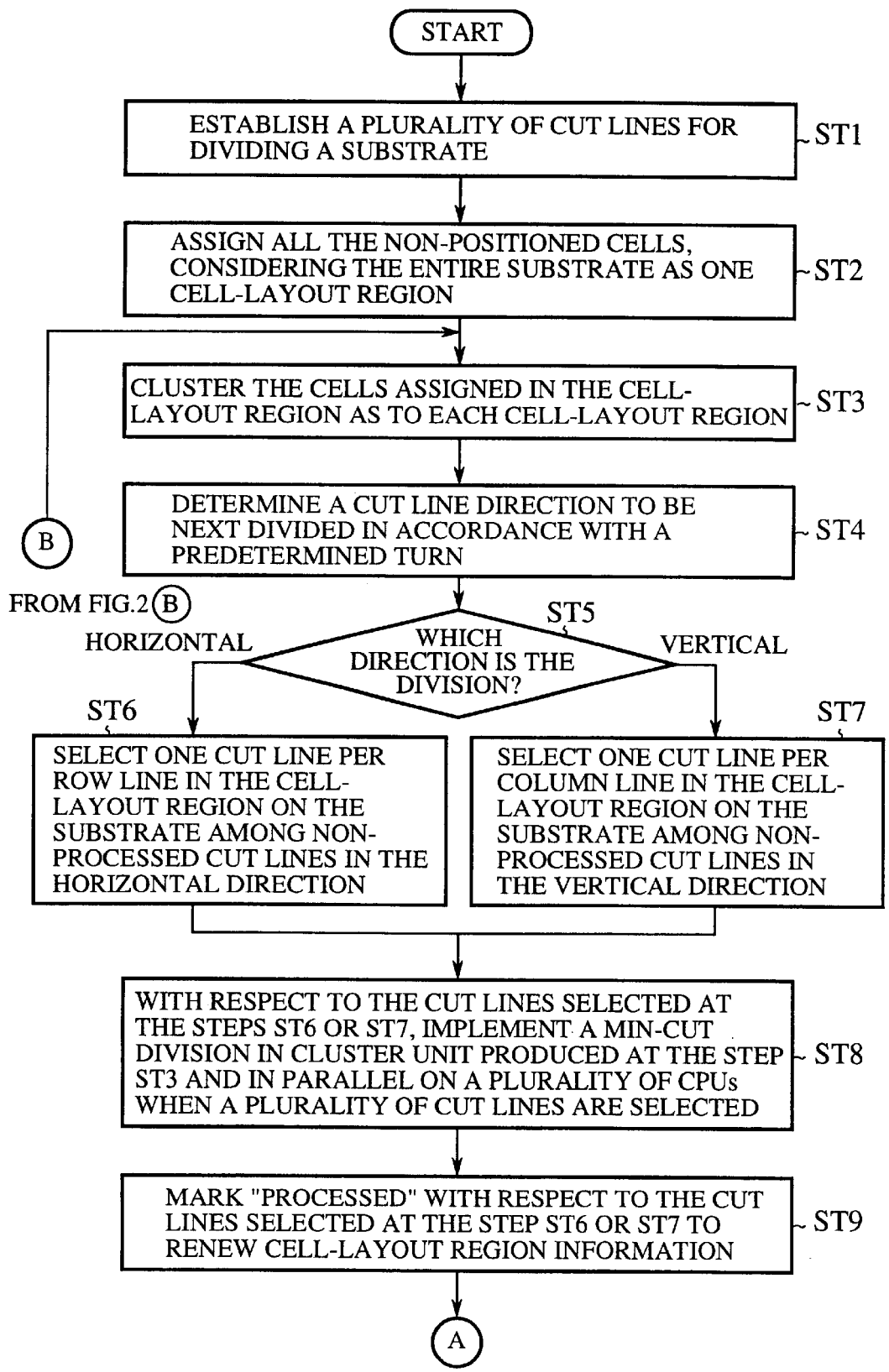
FIG. 1 is a flow chart showing a method of a cell-layout in an integrated circuit device according to Embodiment 1 of the present invention.

FIG. 1 is a flow chart showing a method of a cell-layout in an integrated circuit device according to Embodiment 1 of the present invention. In the drawing, ST1 designates a step of establishing a plurality of cut lines which divides an integrated circuit substrate in vertical and horizontal directions, ST2 designates a step of assigning all the non-positioned cells in the circuit in an entire substrate, while it is considered as one cell-layout region, ST3 denotes a step of clustering such that a plurality of cells within the cell-layout region is defined as one cluster, ST4 designates a step of determining a cut-line direction to be next processed in accordance with a predetermined turn, ST5 designates a step of distinguishing a division direction in accordance with the direction determined ST4 to branch the process, ST6 and ST7 designate steps of selecting one cut line per row line and one cut line per column line in the cell-layout region on the substrate among non-processed cut lines in the horizontal and vertical directions, respectively, depending on the direction determined ST4, ST8 designates a step of, with respect to the cut lines selected at the steps ST6 or ST7, implementing a Min-Cut division in cluster unit produced at the step ST3 and in parallel on a plurality of CPUs when there exist a plurality of the cut lines selected at the step ST6 or ST7, ST9 designates a step of marking "processed" with respect to the cut lines selected at the step ST6 or ST7 to renew cell-layout region information in accordance with the division result at the step ST8.

Consecutively, ST10 designates a step of distinguishing whether or not the number of the cell-layout regions is a predetermined value or more, or whether or not the process is implemented with respect to all the cut lines, to branch the process flow to a virtual wire congestion equalizing process in steps ST11 to ST19 when the above distinction is YES, ST11 designates a step of estimating a virtual wire congestion degree of the wires in the horizontal direction within each cell-layout region produced by the division, ST12 designates a step of changing heights of the cell-layout regions to equalize a virtual wire congestion degree of the wires in the horizontal direction within the cell-layout regions located in the same column, ST13 designates a step of implementing again the Min-Cut division with respect to the cell-layout regions on a plurality of CPUs in accordance with the turn selected at the step ST6, when the cell-layout regions intersect with the cut line selected already at the step ST6 as a result of the step ST12, ST14 designates a step of renewing the cell-layout region information in accordance with a result of the re-implementation of the division at the step ST13, ST15 designates a step of estimating a virtual wire congestion degree of the wires in the vertical direction within each cell-layout region produced by the division, ST16 designates a step of changing widths of the cell-layout regions to equalize the virtual wire congestion degrees of the wires in the vertical direction within the cell-layout regions located in the same column, ST17 designates a step of implementing again the Min-Cut division with respect to the cell-layout regions on a plurality of CPUs in accordance with the turn selected at the step ST7 when the cell-layout regions intersect with the cut lines selected already at the step ST7 as a result of the step ST16, ST18 designates a step of renewing the cell-layout region information in accordance with a result of the re-implementation of the division at the step ST17, ST19 designates a step of distinguishing whether or not all the processes are completed, ST20 designates a step of renewing a condition for implementing a next equalizing process for the virtual wire congestion degree after the implementation of the equalizing process. It is designed to repeat the steps ST3–ST5, step ST6 or ST7, steps ST8–ST20 in this turn until a distinction that the processes with respect to all the cut lines are completed.

The Min-Cut division here is confirmed as follows: a cell-layout region intersecting with a cut line is divided into two cell-layout regions, i.e. two small regions, by this; to minimize the number of signal lines intersecting with the cut line, and to equalize cell-densities (a ratio of the sum of cell areas assigned within a cell-layout region to cell areas locatable within the cell-layout region) within cell-layout regions after the division, cells assigned in a cell-layout region before the division are divided between two cell-layout regions produced by the division.

In a conventional cell-layout method, a division process of a substrate is implemented on each cut line. However, among the divisions in the Min-Cut placement, a division by a cut line in the same direction which does not intersect with the same region is an independent issue in which each other's results are not affected mutually. Accordingly, when these division processes are implemented in parallel on a plurality of CPUs, the process time may be cut down without worsening the layout quality.

According to this method, while that division progresses to some extent to increase the number of the regions produced by the division, cut lines permitting a parallel process increase, thereby enhancing an effect of cutting the process time owing to the parallel process. However, the divisions with initial several cut lines are impossible in the parallel process, and take a process time similar to the prior art. Therefore, prior to making a start on the Min-Cut placement, a set of several cells is defined as a cluster; in the initial several cut lines, the divisions are implemented in cluster unit; after increase of the cut lines permitting the parallel process, an application of the above method cuts down further the process time.

Next, FIGS. 3–9 are views for an operational explanation related to a method of a cell-layout in an integrated circuit device according to Embodiment 1 of the present invention. In the drawings, reference numerals 21a–21g denote peripheral input/output cells, 22a–22l denote cells to placed, 23a–23u denote signal lines, 24a–24d denote logic hierarchy blocks, 25 denotes a substrate, 26a–26p denote slots for placing the peripheral input/output cells, 27a–27p denote slots for placing the cells, 28 denotes a wire grid designating a position where wires are passable, 29a–29f denote cut lines for the Min-Cut division process, 31a–31f denote cell-layout regions generated by the division, 32a–32s denote wiring patterns, 30a, 30b denote clusters of cells produced by the clustering process, and 32t, 32u denote as an example wiring patterns for interconnecting with the signal lines 23t, 23u, respectively.

Figure 2:
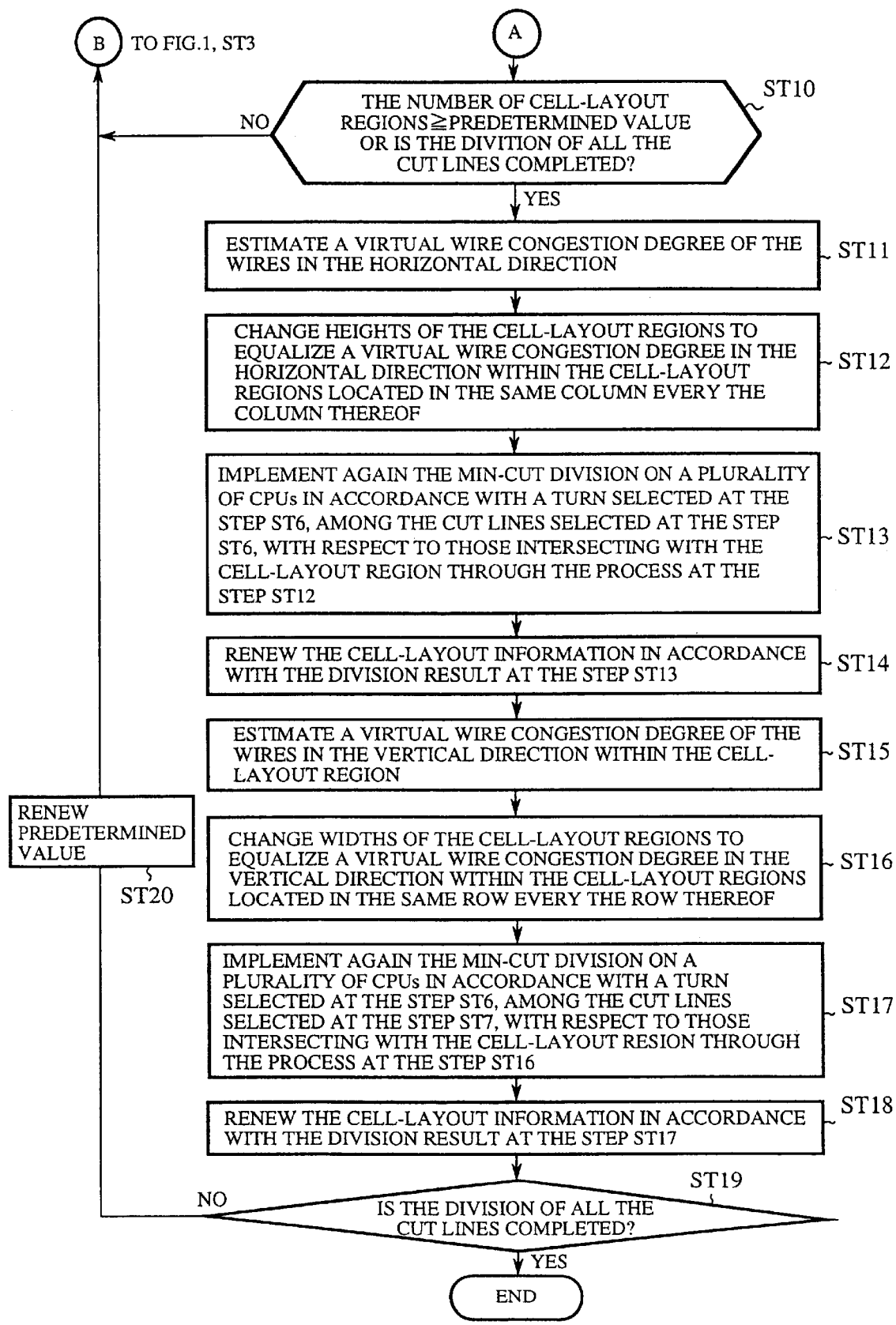
FIG. 2 is a continuative flow chart showing a method of a cell-layout in an integrated circuit device according to Embodiment 1 of the present invention.

Referring to FIGS. 1, 2, the operation of the present invention will be next described.

Figure 3:
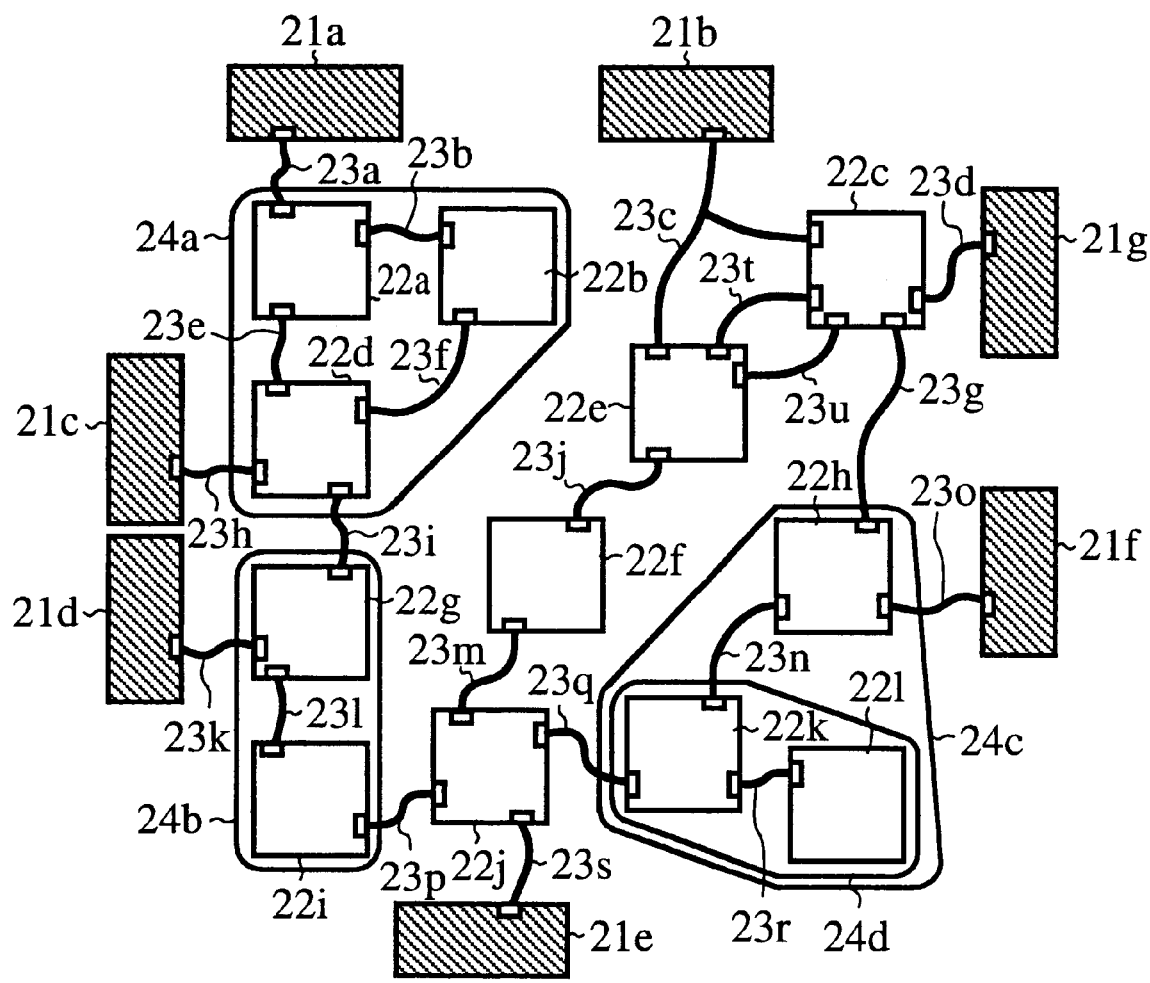
FIG. 3 is an explanatory view of an integrated circuit for a method of a cell-layout in an integrated circuit device according to Embodiment 1 of the present invention.
Figure 4:
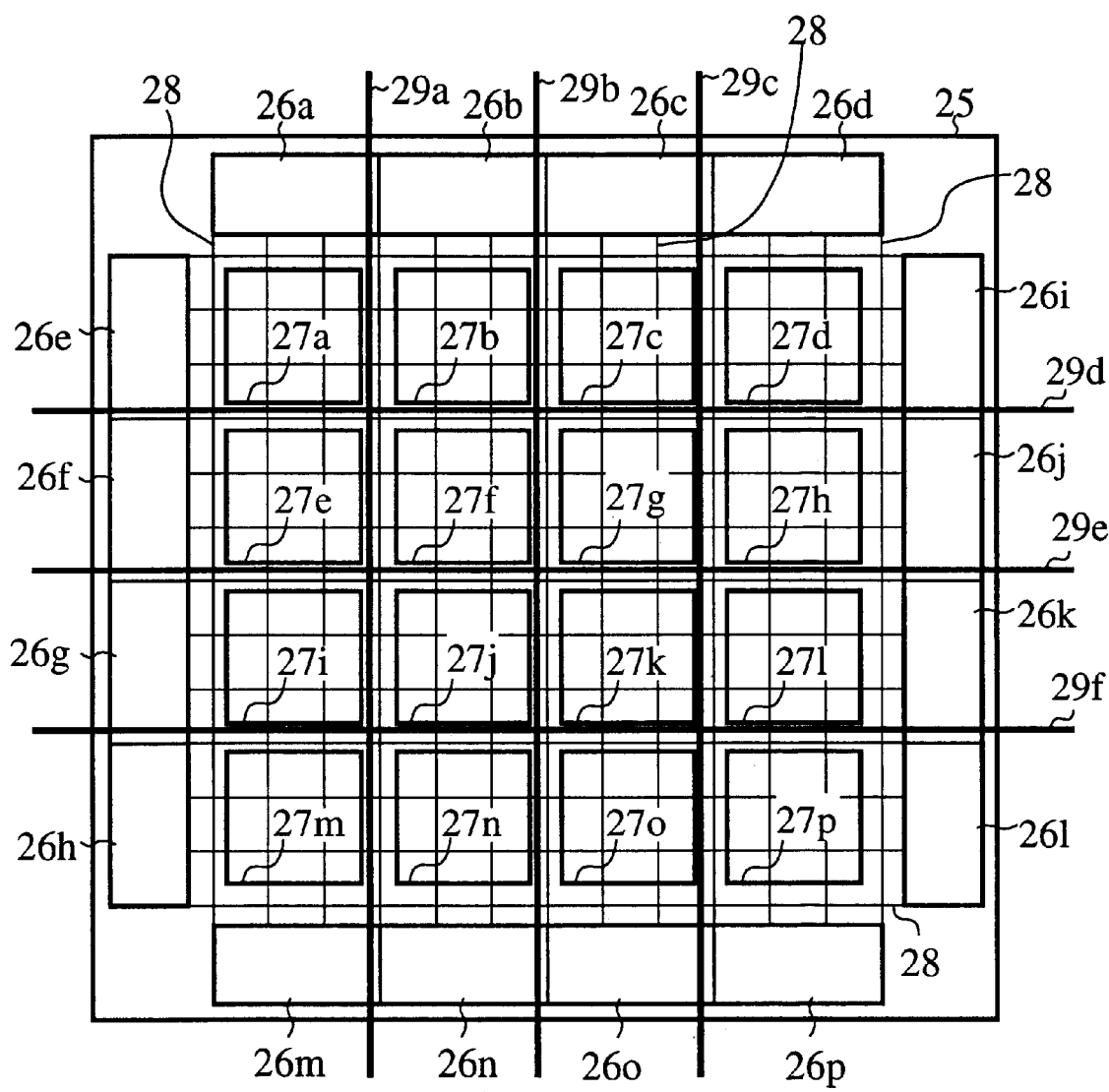
FIG. 4 is an explanatory view of a substrate for a method of a cell-layout in an integrated circuit device according to Embodiment 1 of the present invention.

Similar to the prior art, the operation will be described when the circuit shown in FIG. 3 is placed on the substrate 25 shown in FIG. 4. First, ST1, the cut lines 29a–29e are established to divide the substrate 25, like the prior art. Then, it is established that only one slot is included in a field enclosed by the cut line, thus processing the divisions in the horizontal and vertical directions alternately with respect to the cut lines 29a–29f. In the step ST2, the entire substrate 25 is considered as one cell-layout region, which is assigned by all the cells 22a–22l. In the step ST3, a clustering is implemented upon cells within the cell-layout region.

Figure 5:
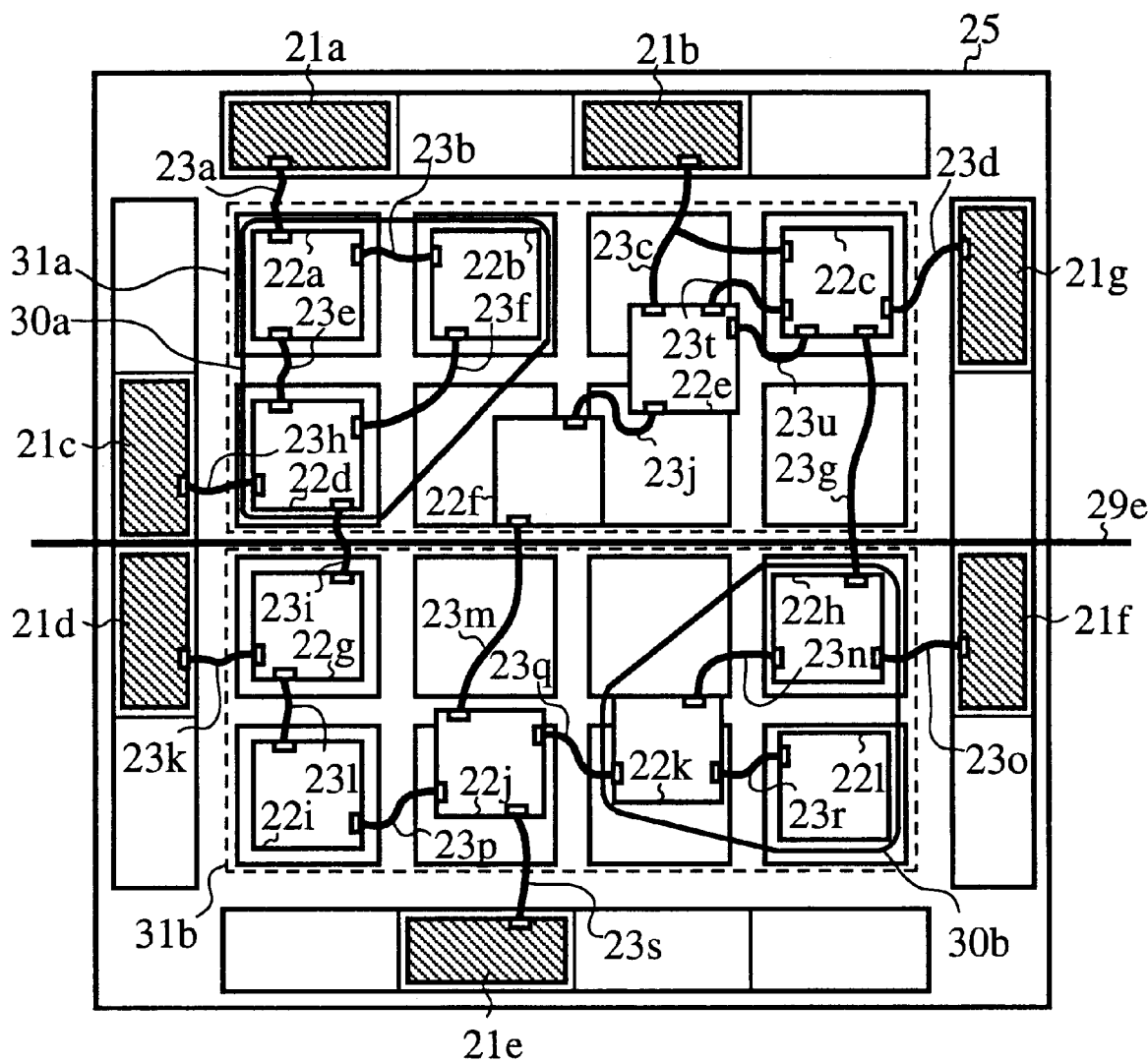
FIG. 5 is an explanatory view still in progress for a method of a cell-layout in an integrated circuit device according to Embodiment 1 of the present invention.

As shown in FIG. 5, it is designed that the cells 22a, 22b, 22d are defined as the cluster 30a, while the cells 22h, 22k, 22l are defined as the cluster 30b. In the step ST4, an implement of a horizontal division is determined, and an execution of the step ST6 is selected ST5. In the step ST6, the first cut line 29e is selected, and ST8, the Min-Cut division of the cell-layout region is implemented with the cut line 29e. Then the division is implemented in cluster unit produced by the step ST3. That is, the clusters 30a, 30b each are treated like one cell, and all the cells in one cluster are assigned to the same region.

As a result of the division, two cell-layout regions are produced as shown in FIG. 5: in one region, the cluster 30a, i.e. the cells 22a, 22b, 22d, and the cells 22c, 22e, 22f are assigned to the cell-layout region 31a on the upper side of the cut line 29e; in the other region, the cluster 30b, i.e. the cells 22h, 22k, 22l, and the cells 22g, 22i, 22j are assigned to the cell-layout region 31b on the lower side of the cut line 29e. Then, ST9, the cut line 29e is marked "division-processed" and the layout region information is renewed in accordance with a result of the divisions ST8.

Figure 6:
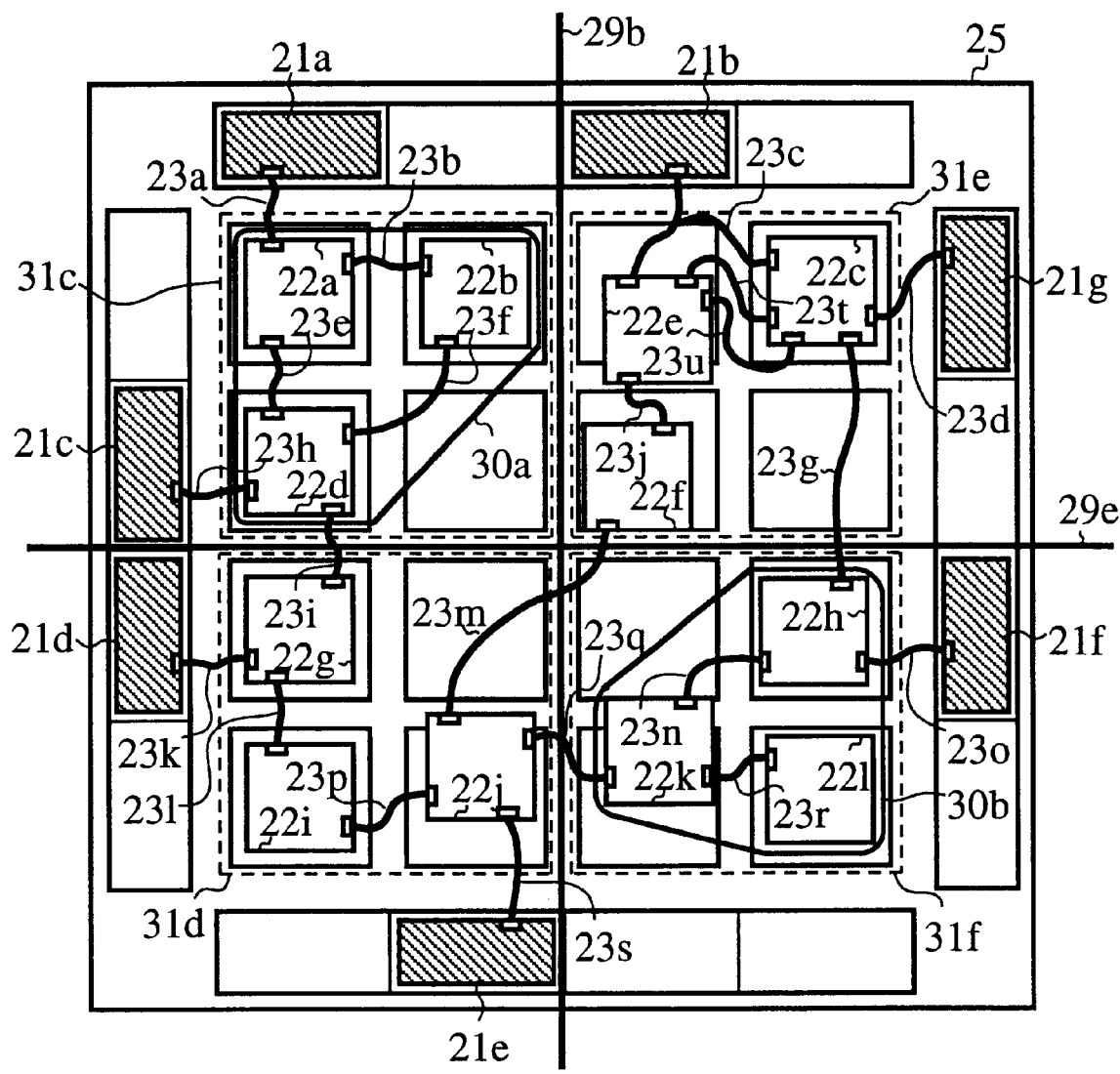
FIG. 6 is an explanatory view still in progress for a method of a cell-layout in an integrated circuit device according to Embodiment 1 of the present invention.

While the step ST10 distinguishes whether or not an equalizing process of the local wire congestion degree is implemented, the process here goes back to the step ST3 due to a predetermined value of four. In the step ST3, the clusters within the cell-layout regions 31a, 31b are reproduced, the clusters 30a, 30b here are produced similarly to the previous pattern. Next, ST4, an implementation of the vertical division is determined, and controlled to execute the step ST7 ST5. The cut line 29b is selected in the ST7, and implements the Min-Cut division with respect to the cut line 29b, as well as the cut line 29e. Thereafter, at the point of time that the step ST9 is completed, the cut lines 29b, 29c are marked "processed", and the four cell-layout regions 31c–31f are produced as shown in FIG. 6. The cells assigned to the cell-layout regions 31c–31f respectively are as follows: the cell-layout region 31c corresponds to the cells 22a, 22b, 22d, the cell-layout region 31d the cells 22g, 22i, 22j, the cell-layout region 3le the cells 22c, 22e, 22f, and the cell-layout region 31f the cells 22h, 22k, 22l.

At this point of time, the number of the cell-layout regions becomes four, and ST10, the process flow is branched to the equalizing process of the local area wire congestion degree s ST11–ST18. First, ST11, the virtual wire congestion degree is estimated in the horizontal direction within each cell-layout region. Here, a virtual wire congestion degree is defined by a ratio of a grid line length in a horizontal wire in which block of cells and signal wires is anticipated, to a wire grid line length within each cell-layout region.

The grid line length in the horizontal wire blocked by one cell is estimated as four grids, and the wiregrid line length required for connections of the signal lines is estimated as [three grids*((the number of terminals connected to the signal lines) –1)]. In this case, three cells are assigned to the cell-layout region 31c, thus the wire grid length blocked by the cells is 4*3=12 grids, while as to the signal lines, there are 5.5 nets, each of which the number of terminals to be connected is 2, the grid line length in which the block is anticipated during the connection of the signal lines becomes 3*1*5.5=16.5. Since the horizontal grid line length within the region is 39 grids, the virtual wire congestion degree in the horizontal wire becomes[(12+16.5)/39]=0.73. Similarly, the virtual wire congestion degrees of the cell-layout regions 31d, 31e, 31f are calculated, and become 0.73, 0.85, 0.62, respectively.

Figure 7:
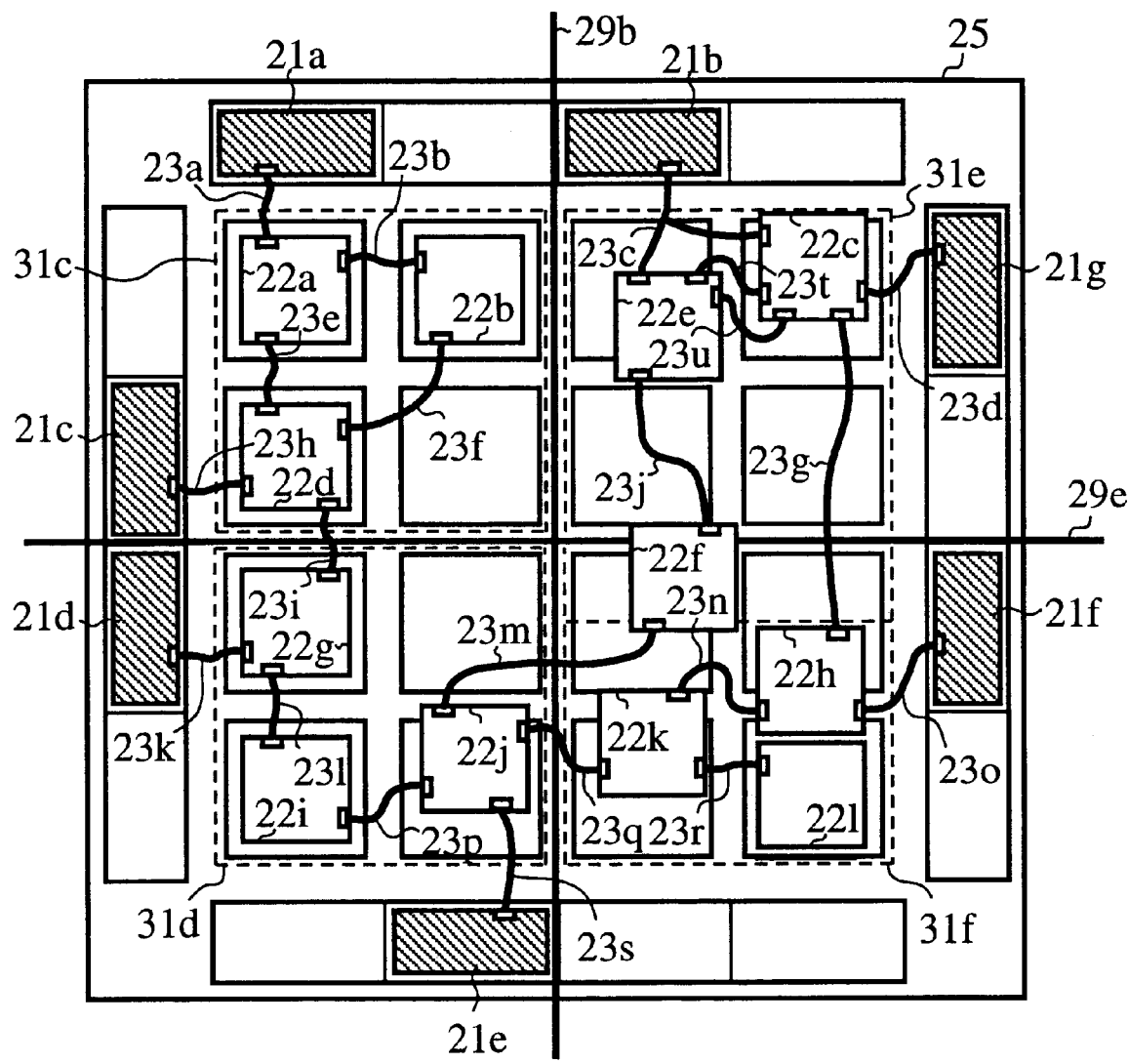
FIG. 7 is an explanatory view still in progress for a method of a cell-layout in an integrated circuit device according to Embodiment 1 of the present invention.

Next, ST12, to equalize the virtual wire congestion degrees found at the step ST11, the height of the cell-layout region is changed on each column of the region. Here, since the congestion degrees on the cell-layout regions 31c, 31d are equal to each other, the height of this column is not changed. However, in order to equalize both the virtual wire congestion degrees as to the cell-layout regions 31e, 31f, the height of the cell-layout region 31e is raised by one half of the height of the slot, while the height of the cell-layout region 31f is lowered by one-half of the height of the slot. Owing to this operation, since the congestion degrees of the cell-layout regions 31e, 31f become 0.69, 0.80 respectively, the maximum value in the virtual wire congestion degree decreases from 0.85 to 0.80. As shown in FIG. 7, since the cell-layout region 31e becomes to intersect with the cut line 29e through the above process, the cell-layout region 31e is subjected to the Min-Cut division by the cut line 29e in the step ST13, with the result that the cell 22f is assigned on the lower side of the cut line 29e. In the step ST14, the position of the border line between the cell-layout regions 31e, 31f is returned to the previous position of the cut line 29e, and the cell 22f is assigned again from the cell-layout region 31e to the region 31f in accordance with the division result of the step ST13, thus resulting in a cell-layout state shown in FIG. 8.

Figure 8:
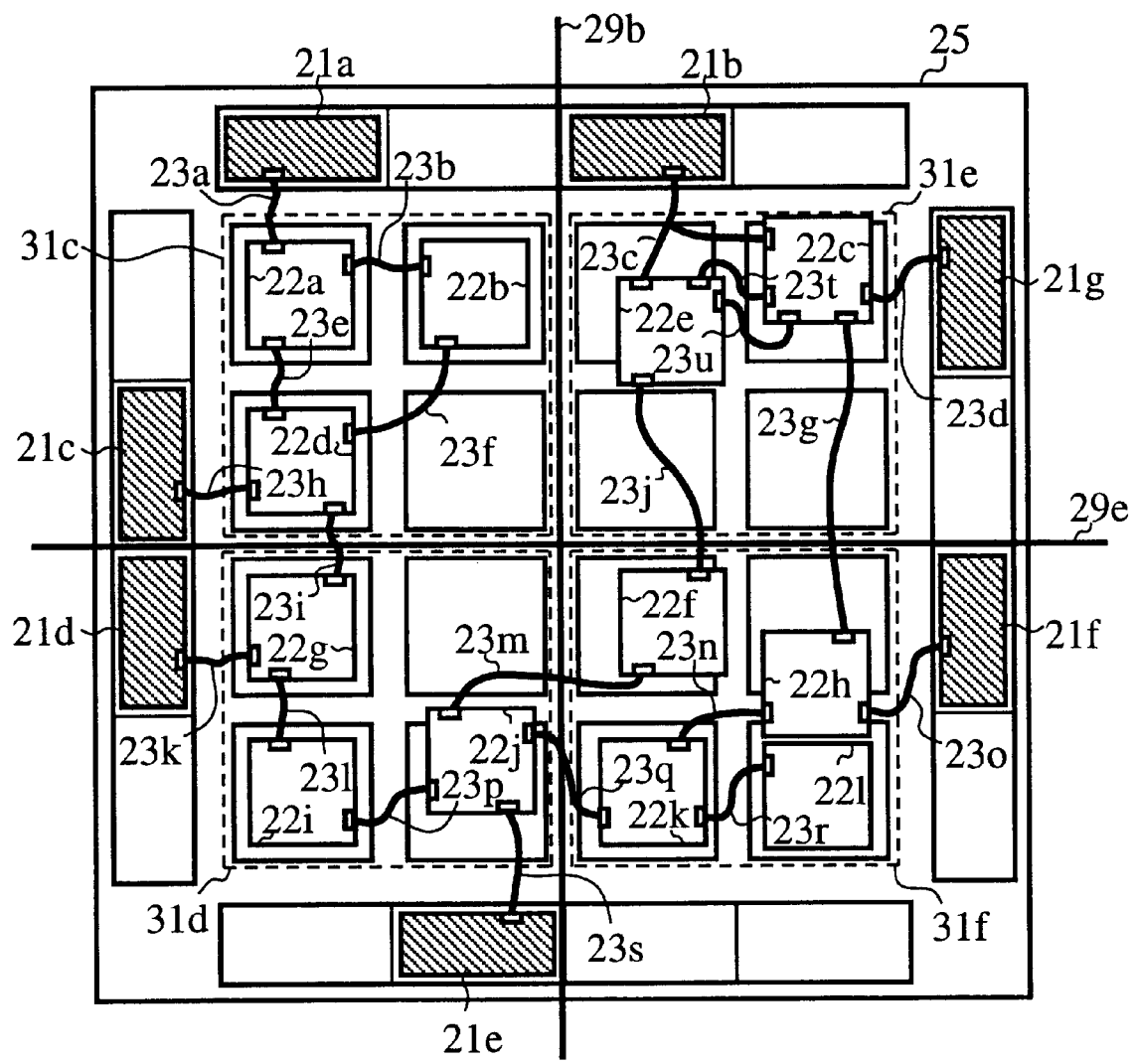
FIG. 8 is an explanatory view still in progress for a method of a cell-layout in an integrated circuit device according to Embodiment 1 of the present invention.

In the step ST15, when the virtual wire congestion degrees are estimated on the wires in the vertical direction of each cell-layout region as well as the horizontal wires, the congestion degrees of the cell-layout regions 31c, 31d, 31e, 31f become 0.73, 0.73, 0.67, 0.79 in this order, respectively. In the step ST16, even if widths of the cell-layout regions are adjusted, the virtual wire congestion degrees cannot be equalized to each other; in other words, the maximum value of the degrees cannot be lowered, and thereby a change of the widths is not implemented. For this reason, ST18, there are no cell-layout regions for re-division; even through the step ST18, there remain the cell-layout regions as shown in FIG. 8.

The step ST19 next distinguishes whether or not the entire cut lines are processed, and branches to the step ST20 because of the presence of the non-processed cut lines. Next, in the step ST20, the time to implement the equalizing process of the virtual wire congestion degree is determined. Here, the predetermined value of 4 is multiplied by four times, and when the cell-layout regions reaches 16, the equalizing process of the virtual wire congestion degree would be implemented.

Thereafter, the clustering process is implemented by returning to the step ST3. Here, it is assumed that any clusters are not produced because of a small area of each of the cell-layout regions. In the step ST4, an implementation of the horizontal division is determined, and the process flow is branched to the step ST6 ST5. In the step ST6, the cut lines 29d and 29f are selected, which divide the row between the cell-layout regions 31c, 31e and the row between the regions 31d, 31f, respectively. Next, though the Min-Cut division is implemented ST8, two cut lines here are selected. Accordingly, the divisions with the respective cut lines are implemented in parallel on different CPUs. After the Min-Cut division is completed by the two cut lines 29d, 29f, the cell-layout region information is renewed with marked "processed" for the cut lines 29d, 29f ST9. At the point of time, since the number of the cell-layout regions is 8, the process flow returns to the step ST3 ST10, and the divisions by the cut lines 29a, 29c are implemented in the steps ST3–ST5, ST7–ST9. In the step ST8, the respective divisions by the cut lines 29a, 29c are processed in parallel on different CPUs, as well as the divisions by the cut lines 29d, 29f. Since the processes with the entire cut lines are completed, the step ST10 branches to the process of the virtual wire congestion degree.

Here since there is a state that the 16 cell-layout regions exist, each of which includes one slot, the heights and/or widths of the cell-layout regions cannot be changed to equalize the wire congestion degrees s ST12, ST16, and thereby there are no changes for the division results. However, when the Min-Cut divisions by a plurality of cut lines are executed s ST13 and ST17 owing to a larger scale integrated circuit, in accordance with a turn selected at the steps ST6, ST7, the cut lines processed in parallel on a plurality of CPUs s ST8 are also processed in parallel on a plurality of CPUs s 13 and ST17. Finally, the process flow is ended based on the distinction ST19, resulting in the cell-layout result shown in FIG. 9.

Figure 9:
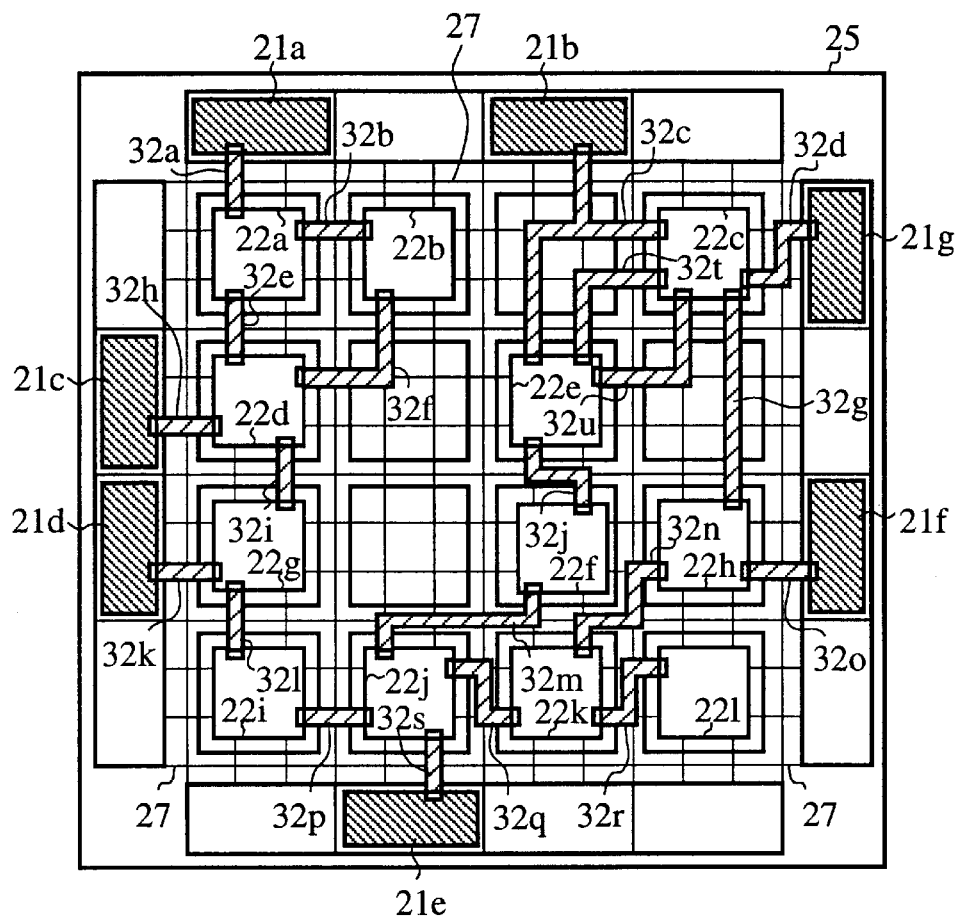
FIG. 9 is an explanatory view of a wire-layout result for a method of a cell-layout in an integrated circuit device according to Embodiment 1 of the present invention.

After completion of the above mentioned cell-layout, one example is shown in FIG. 9, as a result that the signal lines 23a–23u are connected with the wiring patterns 32a–32u by a wiring process. According to the result of the cell-layout, a concentration of many signal lines to a part of the substrate 25 is avoided, the wiring of the whole signal lines becomes possible by the wiring process implemented after the cell-layout.

As described above, according to Embodiment 1, a clustering process of cells is implemented, and the Min-Cut division process is executed in cluster unit and a part of the Min-Cut division is processed in parallel, thereby resulting in an effect that may place even a large integrated circuit in a short process time. Then, only independent issues such that each other's results are not effected mutually are processed in parallel, resulting in not aggravating the division results.

In addition, according to Embodiment 1, an occurrence of local area wire congestion in which wires crowd together at a part on a substrate may be prevented, thus obtaining a favorable layout result to facilitate wiring of all the signal lines. Therefore, the integration of the complete integrated circuit device may be enhanced, and a process time required for a wiring process may be reduced.

Embodiment 2

According to the above cell-layout method, a quality of cell-layouts depend on how to define any cells as one cluster.

In general, it is preferable that a cell with stronger linkage, i.e. a cell having many signal lines interconnecting between the cells, defines as a cluster. According to Embodiment 2 of the present invention, since the cell with stronger linkage is often included in a logic hierarchy block at the time of a logic design of an integrated circuit, the cell having many signal lines included in the hierarchy block at the time of the circuit design is defined as a cluster, thereby resulting in a favorable cell-layout result in a short process time As it is described more specifically, one example is to employ logic hierarchy structures in the clustering at the step ST3 of the flow chart in FIGS. 1, 2 used in the description of the above Embodiment 1. In the case that the logic hierarchy block exists, such as the logic hierarchy blocks 24a–24d as shown in FIG. 3, when a cluster in the cell-layout regions 31a, 31b is produced ST3, cell sets included in the logic hierarchy blocks 24a, 24b, 24c each are set as a cluster, while when the cells of the cell-layout regions 31c, 31d, 31e, 31f are produced with the progress of the division, cells included in the logic hierarchy blocks 24b, 24d of small size are defined as a cluster, thus resulting in a favorable layout result in a shorter process time.

As described above, according to Embodiment 2, in the clustering step, the logic hierarchy structures are employed, resulting in a more favorable cell-layout result in a shorter process time.

Further, the following embodiment as one application of Embodiments 1, 2 is considered. In the step ST3, by use of the logic hierarchy structure information added to cells upon the logic design of an integrated circuit, in response to a size of a cell-layout region to be divided, an upper limit of a cluster size (the sum of cell areas included in a cluster) is given, and with the progress of the division as shown in FIGS. 5, 6, a set of the cells included in a lower logic hierarchy block is defined as a cluster. That is, when the region to be divided is large, the upper limit of the cluster size is enlarged; with the division progress, the upper limit of the cluster size diminishes stepwise. Therefore, the process time may be shortened further.

Embodiment 3

According to Embodiment 3 of the present invention, instead of clustering all the logic hierarchy blocks in the clustering process of the above Embodiment 2, the number of the signal lines included in the logic hierarchy block are counted, and a value of [(a) the number of signal lines connected with only cells in a logic hierarchy block/(b) the number of all signal lines connected with cells in a logic hierarchy block] is an evaluated value of the logic hierarchy block, and only the logic hierarchy block satisfying a predetermined standard value may be employed as a cluster. In this manner, only the logic hierarchy block including the cells with strong linkage is set as a cluster.

Figure 10:
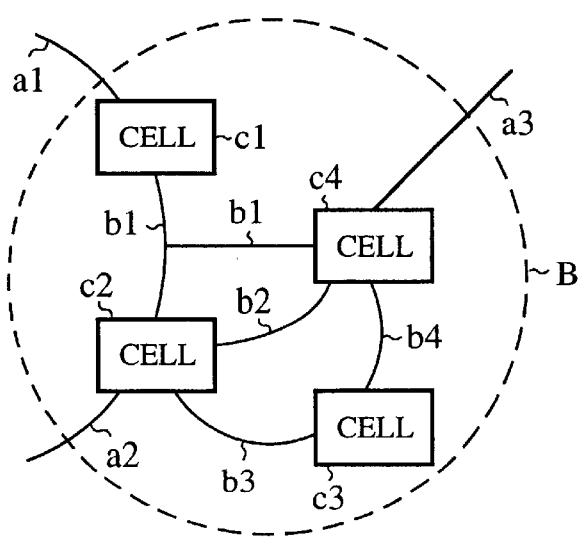
FIG. 10 is an explanatory view showing one example of a logic hierarchy block for a method of a cell-layout in an integrated circuit device according to Embodiment 3 of the present invention.
Figure 11:
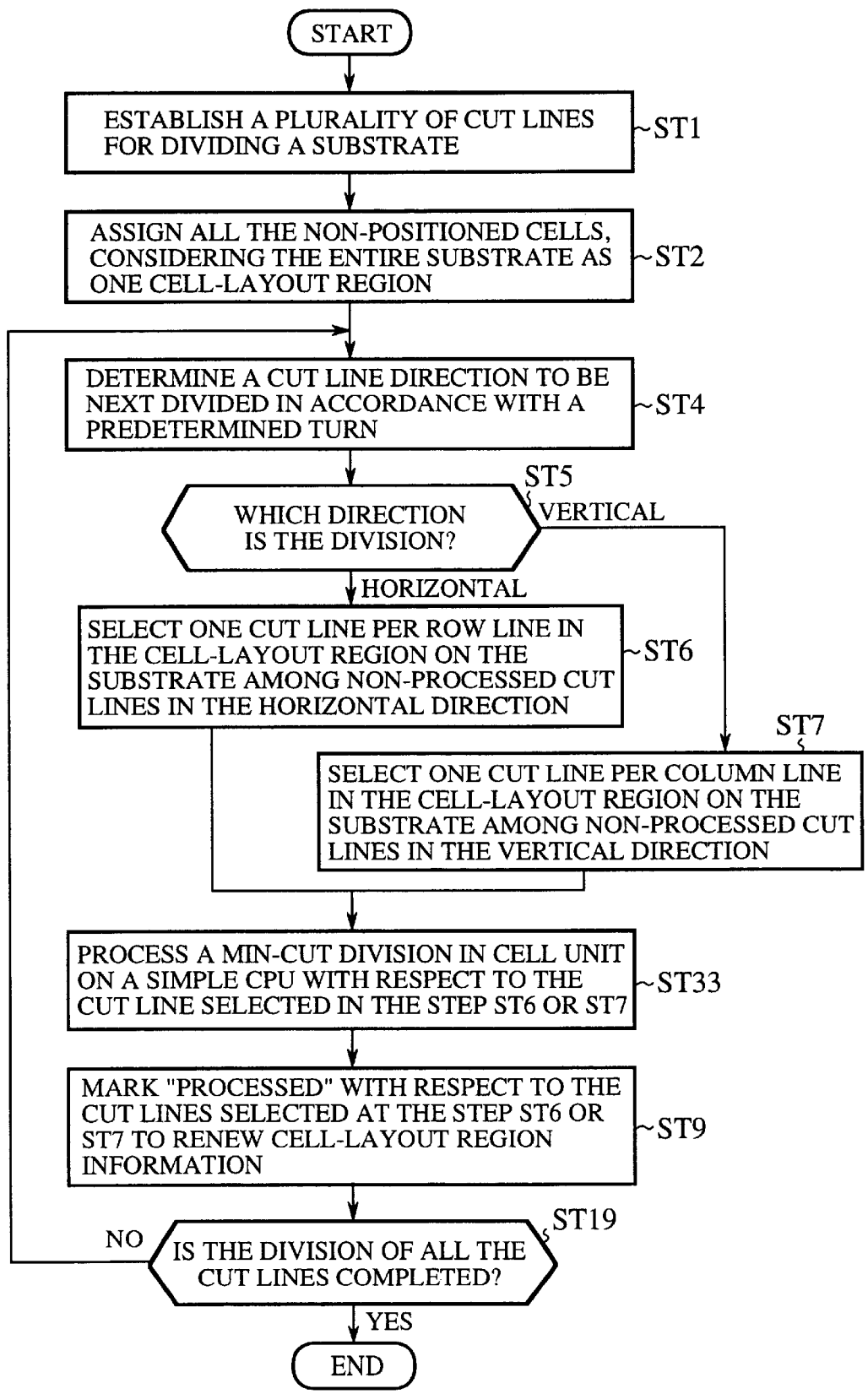
FIG. 11 is a flow chart showing a conventional method of a cell-layout in an integrated circuit device.
Figure 12:
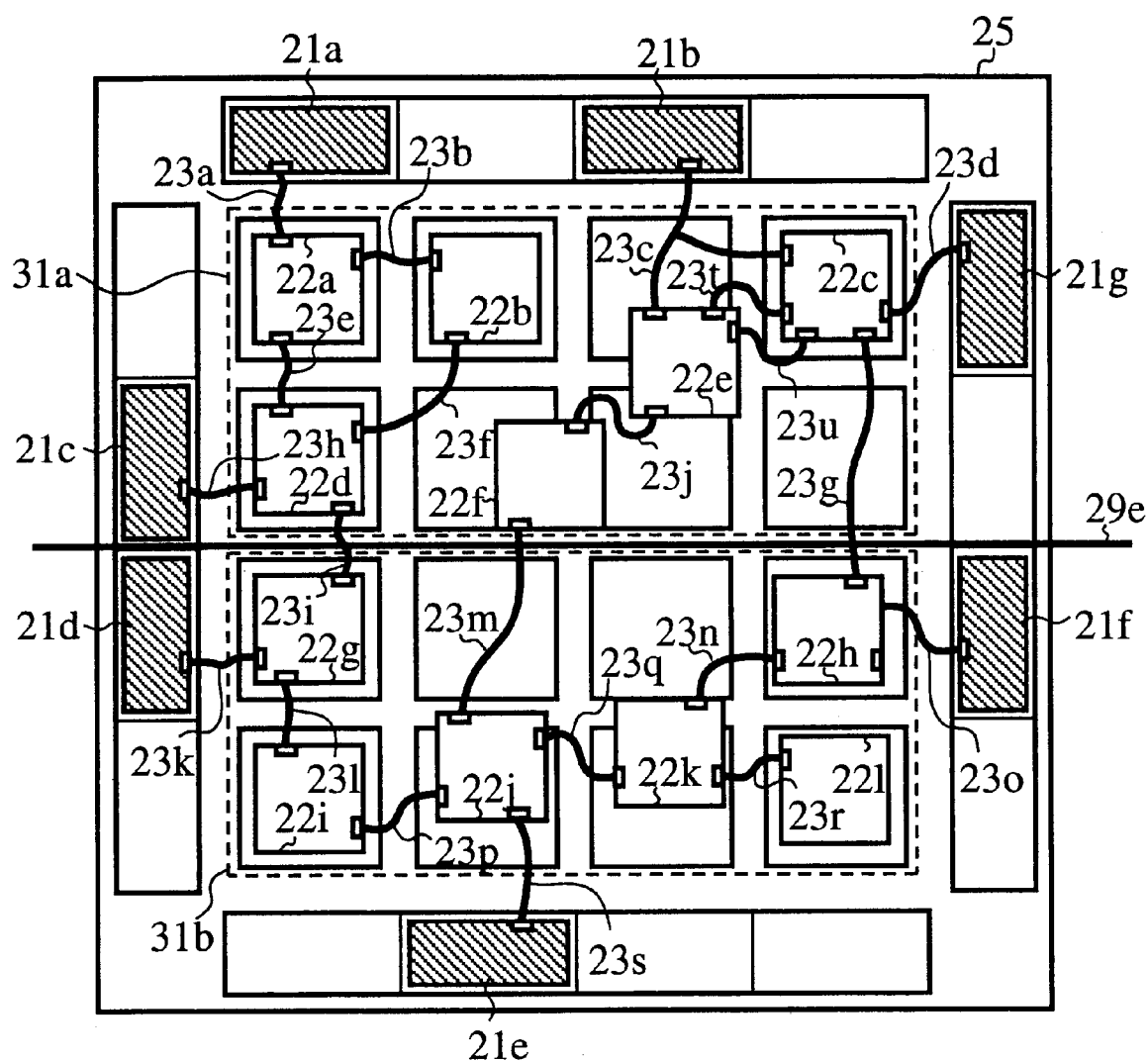
FIG. 12 is a flow chart showing a conventional method of a cell-layout in an integrated circuit device.
Figure 13:
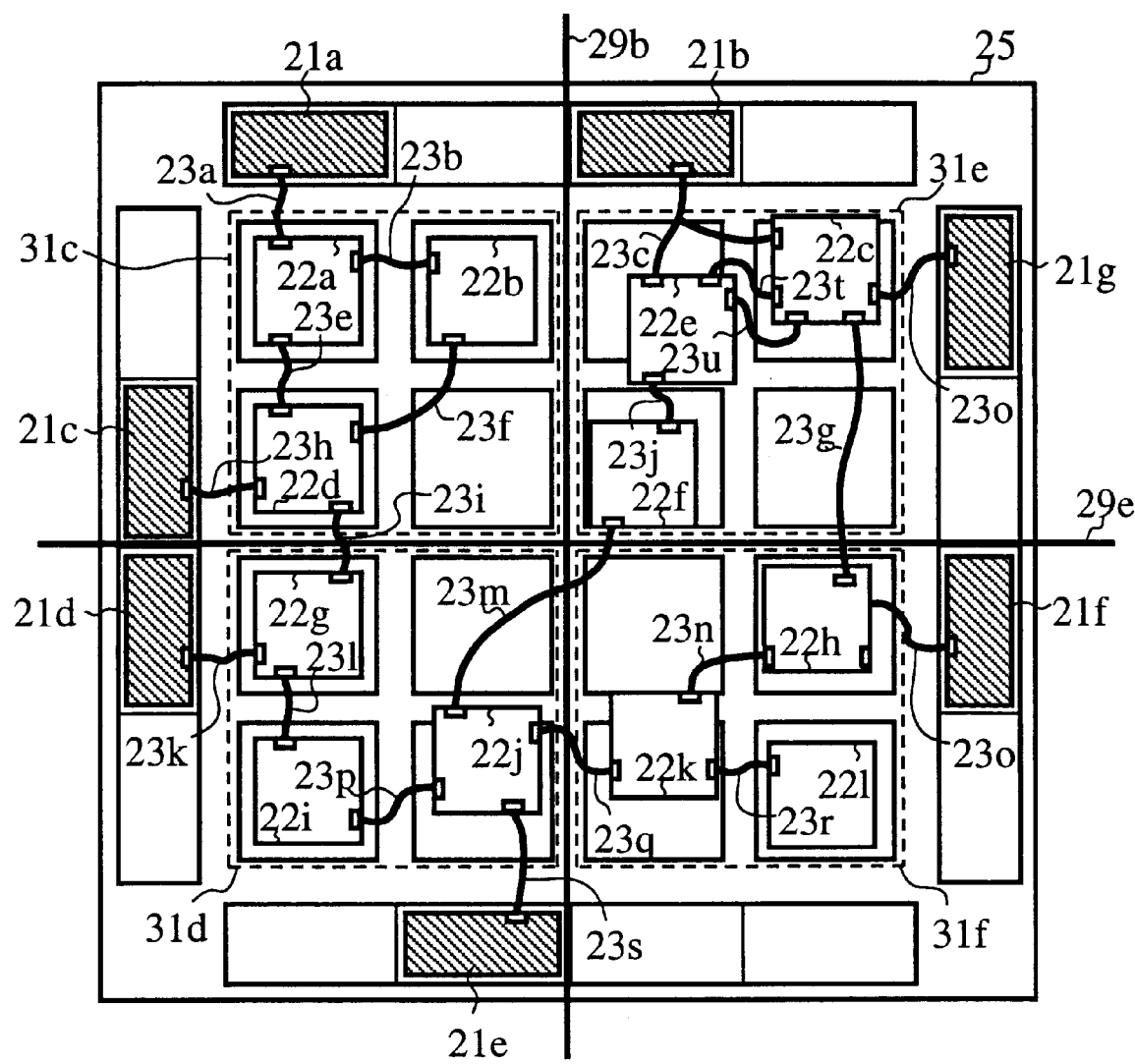
FIG. 13 is a flow chart showing a conventional method of a cell-layout in an integrated circuit device.
Figure 14:
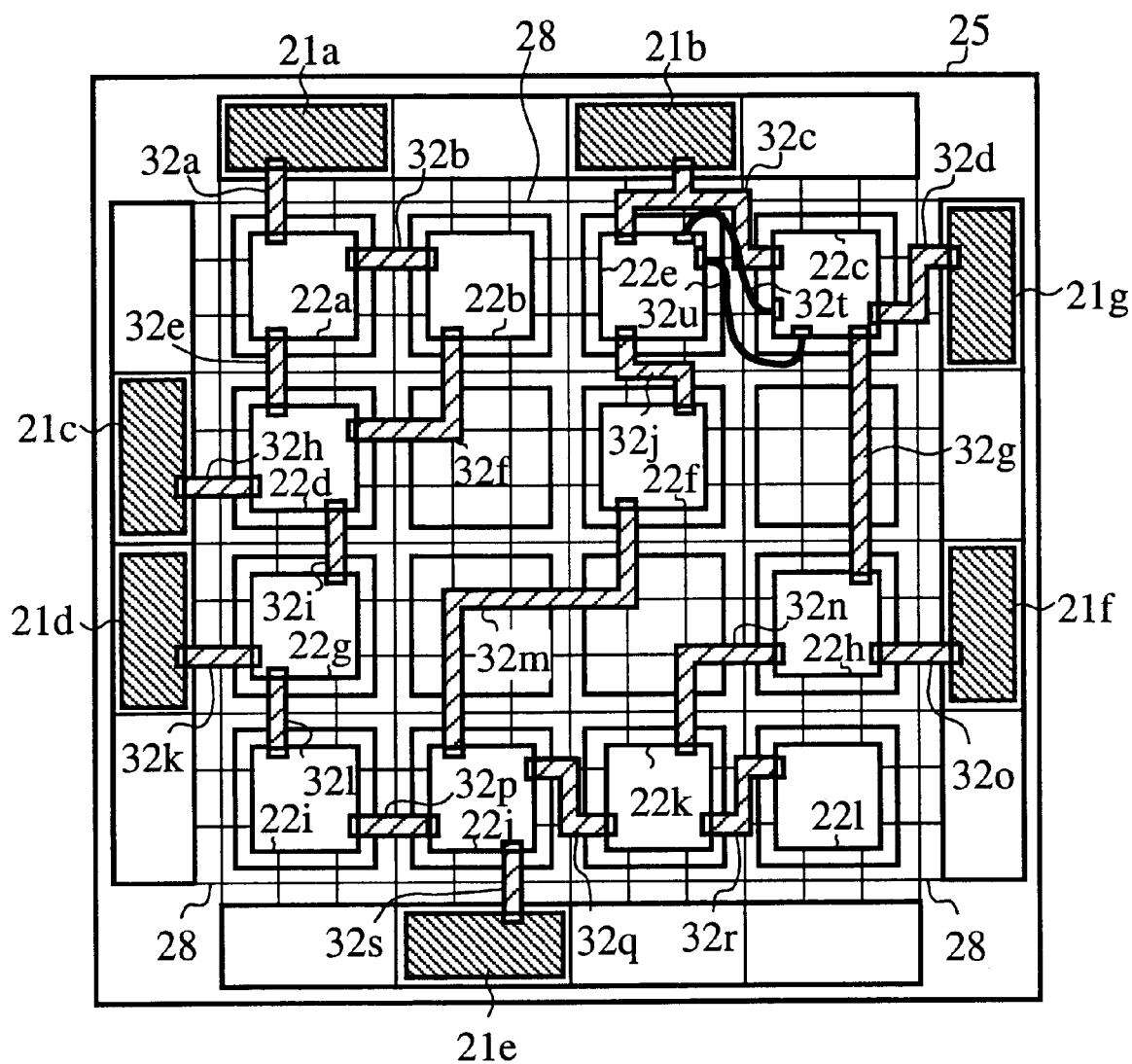
FIG. 14 is an explanatory view of a wire-layout result for a conventional method of a cell-layout in an integrated circuit device.

This will be described referring the drawing. FIG. 10 is an explanatory view showing an connection relation between signal lines and cells in a logic hierarchy block according to Embodiment 3 of the present invention. In the drawing, a1–a3 designate signal lines connecting with anything except the cells in the logic hierarchy block, b1–b4 designate signal lines connecting with only the cells in the logic hierarchy block, c1–c4 designate cells, and B designates a logic hierarchy block. Applying the example of FIG. 10 to the above formula, there are 4 on the signal lines b1–b4 corresponding to (a), while there are 7 on the signal lines a1–a3, b1–b4 corresponding to (b); accordingly, an evaluated value becomes 4/7.

As described above, according to Embodiment 3, only the logic hierarchy block including cells with strong linkage may be set as a cluster, thereby resulting in enhancing a possibility of favorable cell-layout results.

What is claimed is:

1. A method of a cell-layout in an integrated circuit device, comprising:

a first step of establishing a plurality of cut lines in vertical and horizontal directions to divide a substrate;

a second step of considering the entire substrate as one cell-layout region and assigning all the cells included in an integrated circuit in said cell-layout region;

a third step of defining as one cluster a set of a plurality of cells within said cell-layout region;

a fourth step of determining a direction of the cut line to division-process said cell-layout region;

a fifth step of selecting one cut line per row or column of the cell-layout region on the substrate among non-processed cut lines in the horizontal or vertical direction based on the determined direction;

a sixth step of determining a cell to be placed in said cell-layout region by implementing a Min-Cut division in a cluster unit with respect to said cut line selected at said fifth step, thereby dividing the substrate into smaller regions and implementing said division in parallel with respect to a plurality of said cut lines.

2. A method of a cell-layout in an integrated circuit device according to claim 1, further comprising:

a seventh step for comparing the number of the cell-layout regions with a predetermined value;

an eighth step for changing a height of said cell-layout region so as to equalize an estimated value of virtual wire congestion degree in a horizontal wire within the cell-layout region on the same column, and determining again the cell-layout within the cell-layout region changed in height; and a ninth step for changing a width of said cell-layout region so as to equalize an estimated value of virtual wire congestion degree in a vertical wire within the cell-layout region on the same row, and determining again the cell-layout within the cell-layout region changed in width.

3. A method of a cell-layout in an integrated circuit device according to claim 1, wherein in the third step, by use of logic hierarchy structure information added to the cells at the time of a logic design of the integrated circuit, defined as a cluster is a set of cells included in the largest logic hierarchy block among those smaller than an upper limit of a cluster size determined in response to the size of the small region generated by the division of the cell-layout region by said cut line.

4. A method of a cell-layout in an integrated circuit device according to claim 3, wherein at the third step, set as a cluster is only a block such that a ratio of the number of signal lines connected with only the cells within the logic hierarchy block to the number of signal lines connected with said cells is larger than a predetermined reference value.

5. A method of a cell-layout in an integrated circuit device according to claim 1, wherein the Min-Cut division with respect to the plurality of cut lines in the sixth step is implemented in independent, parallel process by a plurality of CPUs.

* * * * *